(12) United States Patent
Nawata et al.

(10) Patent No.: US 9,052,614 B2
(45) Date of Patent: Jun. 9, 2015

(54) VIBRATION CONTROL APPARATUS, LITHOGRAPHY APPARATUS, AND METHOD OF MANUFACTURING ARTICLE

(75) Inventors: Ryo Nawata, Utsunomiya (JP); Katsumi Asada, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 716 days.

(21) Appl. No.: 13/280,243

(22) Filed: Oct. 24, 2011

(65) Prior Publication Data

US 2012/0105820 A1 May 3, 2012

(30) Foreign Application Priority Data

Oct. 29, 2010 (JP) ................................. 2010-244365

(51) Int. Cl.
*G03F 7/20* (2006.01)

(52) U.S. Cl.
CPC .......... *G03F 7/709* (2013.01); *H01J 2237/0216* (2013.01)

(58) Field of Classification Search
CPC . G03F 7/709; G03F 7/70825; G03F 7/70833; G03F 7/70766; G03F 7/70758; G03F 7/7085; F16F 15/02; F16F 6/00; F16F 15/0232; G02B 27/646; H01J 2237/0216
USPC ............ 355/30, 53, 55, 72, 75; 248/618, 638; 188/378
See application file for complete search history.

(56) References Cited

U.S. PATENT DOCUMENTS

| | | | | |
|---|---|---|---|---|
| 4,796,873 A | * | 1/1989 | Schubert | ........................ 267/136 |
| 6,420,716 B1 | * | 7/2002 | Cox et al. | .................... 250/492.2 |
| 6,493,062 B2 | * | 12/2002 | Tokuda et al. | .................. 355/53 |
| 6,512,571 B2 | * | 1/2003 | Hara | ................................ 355/53 |
| 6,563,128 B2 | * | 5/2003 | Lublin et al. | ................... 250/548 |
| 6,788,386 B2 | * | 9/2004 | Cox et al. | ......................... 355/53 |
| 6,791,664 B2 | * | 9/2004 | Auer et al. | ........................ 355/53 |
| 7,084,956 B2 | * | 8/2006 | Dams et al. | ...................... 355/53 |
| 7,571,793 B2 | | 8/2009 | Warmerdam | |
| 7,817,243 B2 | * | 10/2010 | Heertjes et al. | ................. 355/53 |
| 8,091,694 B2 | * | 1/2012 | Vervoordeldonk et al. | ... 188/378 |
| 2005/0035074 A1 | * | 2/2005 | McGarry | .................... 211/87.01 |
| 2005/0041233 A1 | * | 2/2005 | Van Schothorst et al. | ...... 355/72 |
| 2006/0272910 A1 | * | 12/2006 | Kraner | ........................ 188/266.7 |

(Continued)

FOREIGN PATENT DOCUMENTS

| JP | 10-103403 A | 4/1998 |
|---|---|---|
| JP | 11-230246 A | 8/1999 |
| JP | 2000-065128 A | 3/2000 |

(Continued)

*Primary Examiner* — Steven H Whitesell Gordon
(74) *Attorney, Agent, or Firm* — Canon USA, Inc., IP Division

(57) ABSTRACT

A vibration control apparatus includes a first spring mechanism to support a first object as part of a first system. To control vibration of the first object, a first actuator applies a force to the first object via a command value generated by a first computing based on an output of a detection system. The detection system includes a second spring mechanism to support a second object as part of a second system. A third spring mechanism supports a third object as part of a third system. The first displacement detector detects displacement of the third object relative to the second object. The third object is prevented from being displaced relative to the second object. A second natural frequency of the second system is higher than a first natural frequency of the first system, and a third natural frequency of a third system is higher than the first natural frequency.

18 Claims, 14 Drawing Sheets

(56) References Cited

U.S. PATENT DOCUMENTS

| | | | |
|---|---|---|---|
| 2007/0035074 A1* | 2/2007 | Vervoordeldonk et al. | 267/140.11 |
| 2008/0068603 A1* | 3/2008 | Nawata et al. | 356/244 |
| 2008/0237947 A1* | 10/2008 | Warmerdam et al. | 267/75 |
| 2008/0246200 A1* | 10/2008 | Vervoordeldonk et al. | 267/140.14 |
| 2008/0309910 A1* | 12/2008 | Takahashi | 355/72 |
| 2009/0201484 A1* | 8/2009 | Arai | 355/72 |
| 2010/0149516 A1* | 6/2010 | Loopstra et al. | 355/74 |

FOREIGN PATENT DOCUMENTS

| | | |
|---|---|---|
| JP | 2003-058254 A | 2/2003 |
| JP | 2007-504415 A | 3/2007 |
| JP | 2007-522393 A | 8/2007 |
| JP | 4-083708 B2 | 4/2008 |
| WO | 2005/024266 A1 | 3/2005 |
| WO | 2007/072357 A2 | 6/2007 |

* cited by examiner

FIG. 3
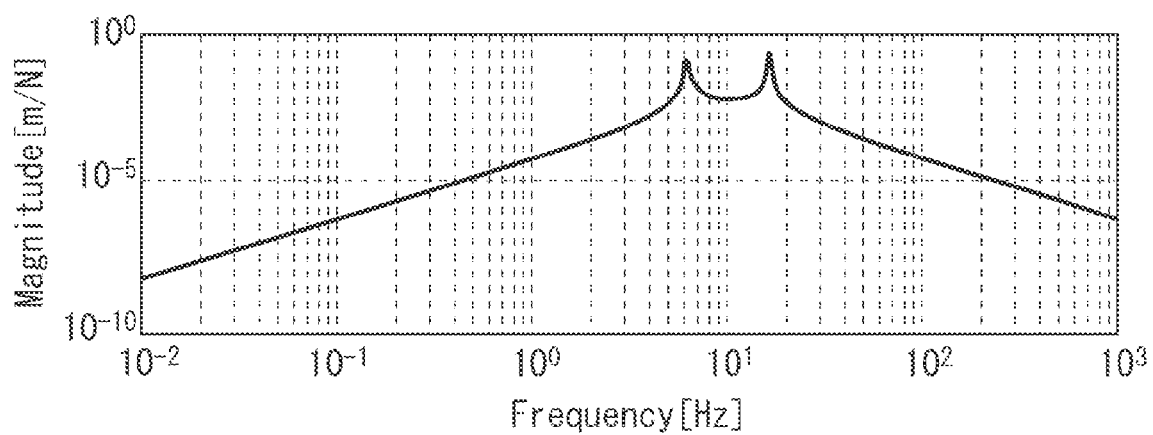
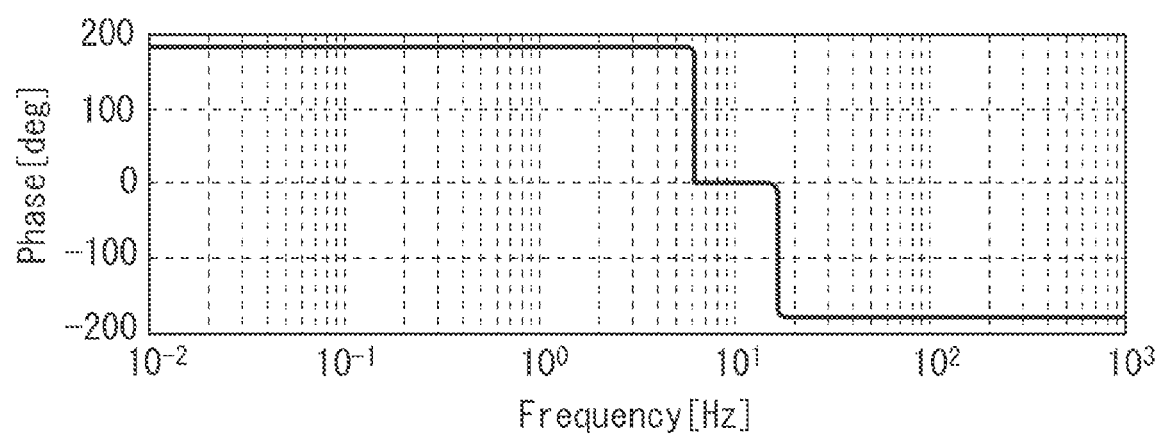

FIG. 5
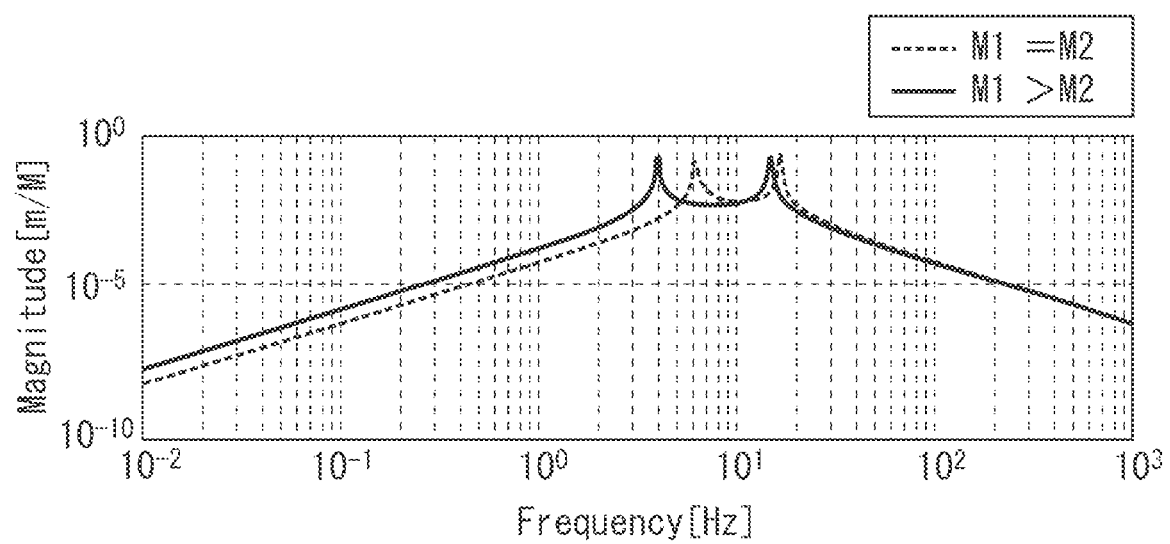
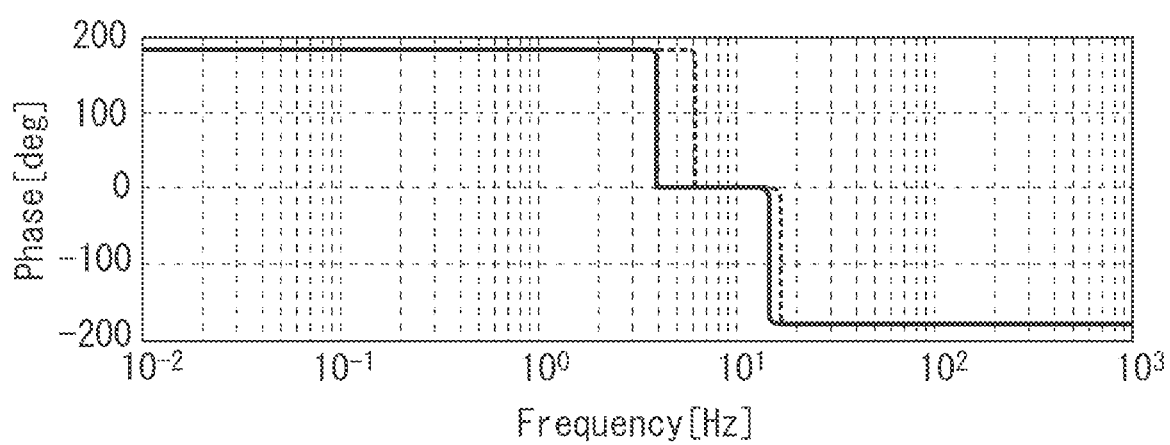

VIBRATION CONTROL APPARATUS, LITHOGRAPHY APPARATUS, AND METHOD OF MANUFACTURING ARTICLE

BACKGROUND OF THE INVENTION

1. Field of the Invention

The present invention relates to a vibration control apparatus, a lithography apparatus, and a method of manufacturing an article.

2. Description of the Related Art

In a lithography apparatus designed to transfer or form ultra-fine patterns, vibration transmitted from a floor, on which the apparatus is mounted, to the apparatus causes degradation of overlay accuracy or resolution (transfer) performance. Thus, in the conventional lithography apparatus, a vibration isolation apparatus supports a main body of the apparatus to reduce an influence of the floor vibration.

The conventional vibration isolation apparatus includes a gas spring that supports the main body (i.e., a vibration control base). Further, a velocity feedback control system which is constituted with an acceleration sensor that detects an acceleration of the vibration control base and an actuator that applies a force on the vibration control base, damps the vibration. However, even when damping of vibration is performed by constituting the velocity feedback control system, a natural frequency of the vibration isolation apparatus, which depends on a natural frequency of the gas spring, becomes 3 to 5 Hz at lowest. In order to remove vibration to even lower frequency, it is necessary to lower the natural frequency of the vibration isolation apparatus.

A vibration isolation apparatus discussed in Japanese Patent No. 4083708 includes a reference object and a support unit for supporting the object, and constitutes a reference object support system having a natural frequency lower than that of a gas spring. Then, by performing feedback control on a position of the vibration control base with reference to a position of the reference object in the reference object support system, the vibration isolation apparatus having the natural frequency lower than that of the gas spring is realized.

In Japanese Unexamined Patent Application Publication (Translation of PCT Application) No. 2007-522393, an active vibration isolation (insulation) system is discussed as a conventional art. A ceiling is located at a height zc. A mass 1 is suspended from the ceiling by a spring 1. An actuator is positioned between the ceiling and the mass 1 so as to control a height z2 at which the mass 1 is positioned. A mass 2 is suspended by a spring 2 from the mass 1. The mass 2 is located at a height z3. A sensor detects a distance "d" between the mass 1 and the mass 2. The distance d serves as a gauge of a difference between the height z2 and a height z3, i.e., z2−z3. The sensor generates a feedback signal to a controller, and the controller generates a control signal for the actuator based on the feedback signal. In this process, the sensor, the spring 2, and the mass 2 form a seismograph, and the mass 2 serves as a reference mass or an inertia mass of the seismograph. Tansmissibility of z2/zc can be improved by feeding back a distance signal d to the controller. Therefore, Japanese Unexamined Patent Application Publication (Translation of PCT Application) No. 2007-522393 discusses the fact that dependence of operation of the mass suspended from the ceiling on operation of the ceiling can be reduced by feeding back the distance signal related to a distance between the mass 1, and another inertial reference mass 2. Then, a displacement of a particular mass with respect to the reference mass 2 is measured.

In Japanese Patent No. 4083708, the natural frequency of the reference object support system is lower than the natural frequency of the gas spring. To realize such a low natural frequency, it is necessary to increase a mass of the reference object or to lower rigidity of the spring. However, increasing the mass of the reference object is not favorable in terms of a space necessary for its arrangement. On the other hand, lowering the rigidity of the spring is also unfavorable in terms of difficulty or costs in manufacturing.

The conventional art discussed in Japanese Unexamined Patent Application Publication (Translation of PCT Application) No. 2007-522393 is the active vibration isolation system that performs vibration isolation with respect to a reference object in a seismograph, and does not discuss a vibration control apparatus that controls vibration of a target object like the vibration isolation apparatus. Therefore, any configuration of the active vibration isolation system which is favorable for being applied to such the vibration control apparatus is not discussed.

SUMMARY OF THE INVENTION

The present invention is directed to, for example, a vibration control apparatus that is beneficial in terms of control of low-frequency vibration and manufacturing thereof.

According to an aspect of the present invention, a vibration control apparatus includes: a first object; a first spring mechanism configured to support the first object, wherein the first object and the first spring mechanism are part of a first system; a first actuator configured to apply a force to the first object; a first computing device configured to generate a command value for the first actuator based on an output of a detection system to control vibration of the first object; and the detection system configured to detect a position of the first object, wherein the detection system includes: a second object, a second spring mechanism configured to support the second object, wherein the second object and the second spring mechanism are part of a second system, a third object configured to support the second spring mechanism, wherein the detection system further is configured to detect a position of the first object relative to at least one of the second object and the third object, a third spring mechanism configured to support the third object, wherein the third object and the third spring mechanism are part of a third system, a first displacement detector configured to detect displacement of the third object relative to the second object, a second actuator configured to apply a force to the third object, and a second computing device configured to generate a command value for the second actuator based on an output of the first displacement detector to prevent the third object from being displaced relative to the second object, wherein the detection system further is configured such that a second natural frequency of the second system is higher than a first natural frequency of the first system, and a third natural frequency of a third system is higher than the first natural frequency.

According to the present invention, for example, a vibration control apparatus that is beneficial in terms of control of low-frequency vibration and manufacturing thereof can be provided.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

FIG. 3 illustrates a transfer function from a second actuator to a displacement detector.

FIG. 5 illustrates a transfer function from a second actuator to a displacement detector.

DESCRIPTION OF THE EMBODIMENTS

Various exemplary embodiments, features, and aspects of the invention will be described in detail below with reference to the drawings.

Figure 1A:
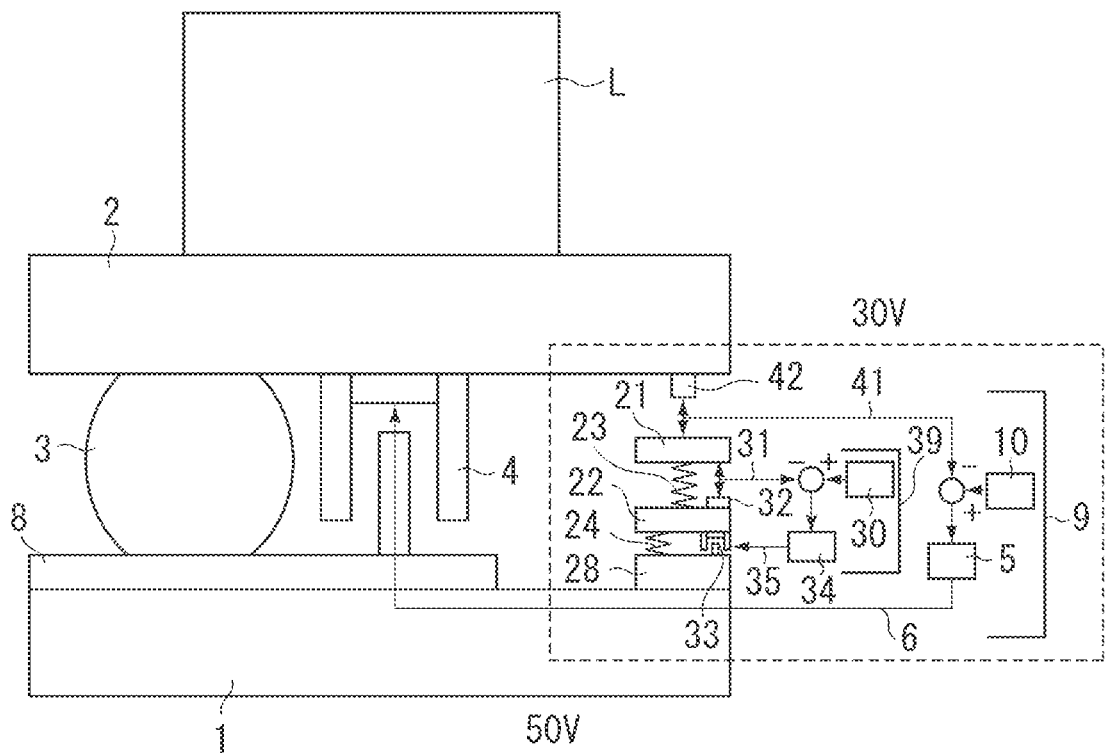
FIG. 1A to 1C illustrate configurations of vibration control apparatuses according to first and third exemplary embodiments.

FIG. 1A illustrates a configuration of an apparatus (e.g., a lithography apparatus) including a vibration control apparatus 50V that controls vibration of a control target (first object) 2 in a vertical direction. The vibration control apparatus 50V is a configuration example of a vibration control apparatus 50, similar to vibration control apparatuses 50V1, 50V2, and 50H which are described below.

The control target 2 is supported on a first base 8 by a first spring mechanism 3. The first base 8 is fixed onto a floor 1. The first spring mechanism 3 can include, for example, a gas spring (air spring). Between the control target 2 and the first base 8, there is arranged a first actuator (first drive unit) 4 for displacing the control target 2 in the vertical direction with respect to the first base 8. The first actuator 4 can include, for example, a linear motor. A unit (main body or a portion thereof) L is included in an apparatus such as a lithography apparatus that transfers a pattern onto a substrate. The control target 2 can be a platform or a surface plate on which the unit is mounted.

The apparatus may be an imprint apparatus that molds an uncured layer on a substrate with a mold, releases the mold, and forms a pattern on the substrate. In such a case, the unit L can include a holding unit (e.g., a substrate holder or a mold holder) that holds at least one of the substrate and the mold.

Further, the apparatus may be a drawing apparatus that projects a charged particle beam onto a layer on a substrate sensitive to the charged particle beam to perform drawing operation (drawing on the layer). In such a case, the unit L can include a holding unit (e.g., a projection system housing or a substrate holder) that holds at least one of the projection system, which projects the charged particle beam, and the substrate.

Further, the apparatus may be an exposure apparatus that projects a light onto a layer on a substrate sensitive to a light to expose the layer. In such a case, the unit L can include a holding unit (e.g., a lens barrel, an original plate holder, or a substrate holder) that holds at least one of the projection system, which projects the light, the original plate, and the substrate.

A detection system 30V detects a position of the control target 2 in the vertical direction. The detection system 30V is a configuration example of a detection system 30X, similar to detection systems 30V1, 30V2, and 30H which are described below. In the detection system 30V, a second object 21 is supported by a third object 22 via a second spring mechanism 23. The third object 22 is supported by a second base 28 via a third spring mechanism 24. The second base 28 is fixed onto the floor 1.

Here, a system including the control target 2 and the first spring mechanism 3, a system including the second object 21 and the second spring mechanism 23, and a system including the third object 22 and the third spring mechanism 24 are referred to as a first system, a second system, and a third system, respectively. In addition, a system including the second object 21, the second spring mechanism 23, the third object 22, and the third spring mechanism 24 is referred to as a fourth system.

The first spring mechanism 3 includes an air spring, and a natural frequency (first natural frequency) of the first system is set to a value in a range of 3 Hz to 5 Hz. In this case, it requires the following conditions to set a natural frequency (second natural frequency) of the second system, or a natural frequency (third natural frequency) of the third system lower than the natural frequency of the first system. More specifically, it requires at least one of increasing a mass of the second object 21 or the third object 22 and reducing rigidity of the second spring mechanism 23 or the third spring mechanism 24.

However, increasing the mass of the second object 21 or the third object 22 is not favorable in terms of a space in which the object to be arranged, and reducing the rigidity of the second spring mechanism 23 or the third spring mechanism 24 has limitations in the manufacture, or is not favorable in terms of manufacturing costs. Thus, in the present exemplary embodiment, the natural frequency of each of the second system and the third system is set higher than the natural frequency of the first system (in this case, a value in the range of 5 Hz to 10 Hz).

There could be a case where one of two natural frequencies of the fourth system is lower than the first natural frequency and the other is higher than the first natural frequency, and a case where both of two natural frequencies of the fourth system are higher than the natural frequency of the first system. In the former case, vibration of the control target 2 can be controlled to even lower frequency. The latter case is favorable in the manufacturing, since the rigidity of each of the second spring mechanism 23 and the third spring mechanism 24 is higher than that in the former case.

In FIG. 1A, a weight of the second object 21 is received by the second spring mechanism 23, and weights of the second object 21 and the third object 22 are received by the third spring mechanism 24. In addition, aside from the second spring mechanism 23 and the third spring mechanism 24, a spring mechanism for receiving its own weight (a weight to be borne by each object) may be provided.

Figure 1B:
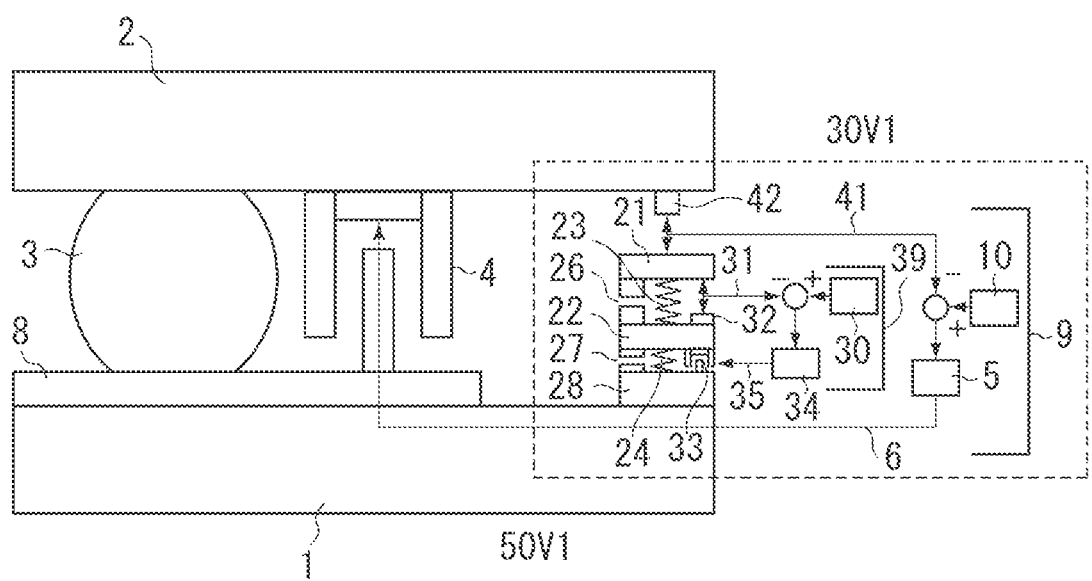

On the other hand, a configuration in the detection system 30V1 of the vibration control apparatus 50V1 in FIG. 1B may be used. More specifically, a weight of the second object 21 may be received by a permanent magnet 26 (which balances a gravitational force on the second object 21 with a repulsive force of the permanent magnet), and weights of the second object 21 and the third object 22 may be received by a permanent magnet 27.

Alternatively, in place of receiving a weight by the permanent magnet, the weight may be received by an actuator. For example, in place of receiving the weight by the permanent magnet 27, the weight may be received by a second actuator (second drive unit) 33 by constantly supplying therewith a necessary electric current (offset current).

Figure 2:
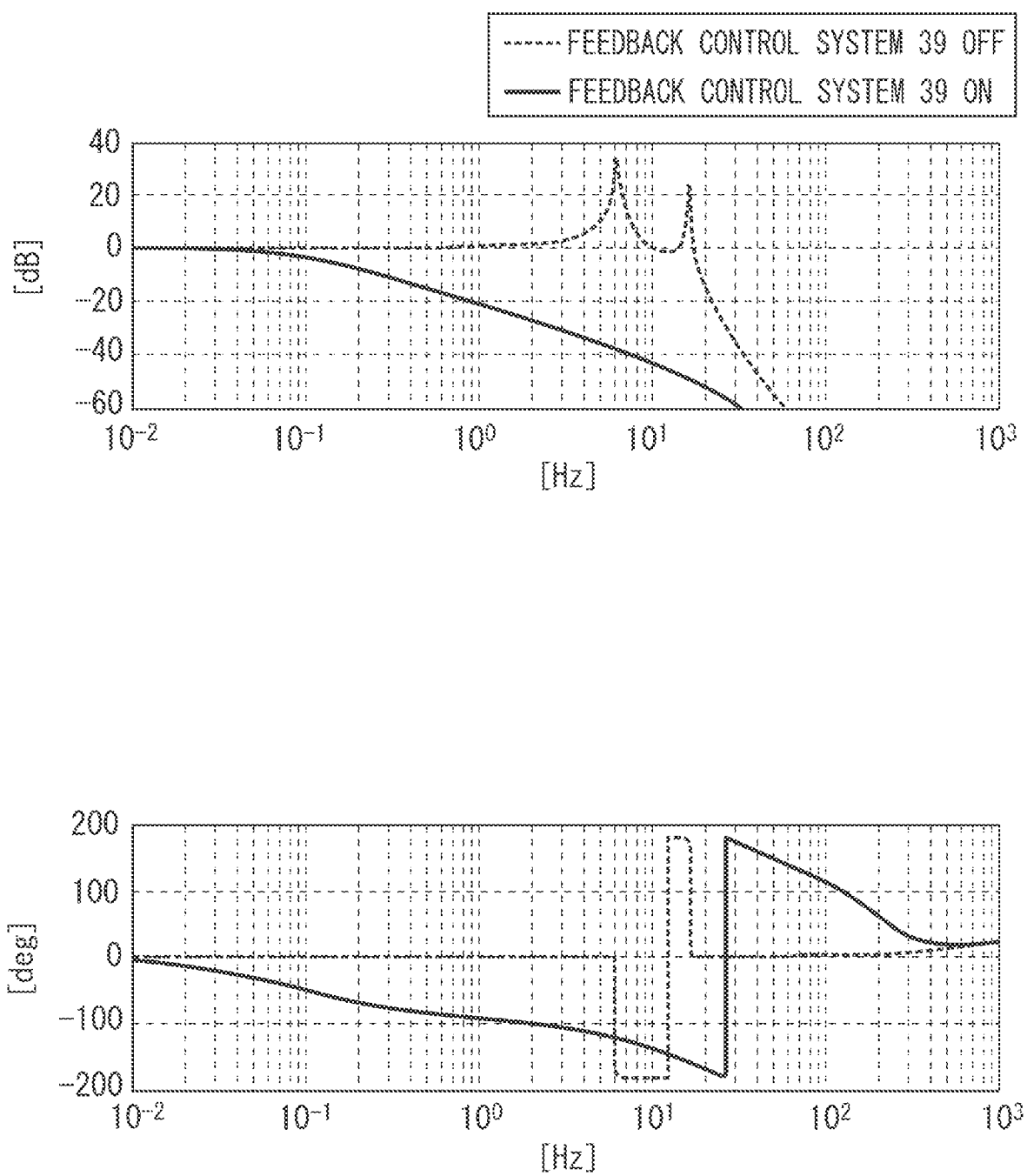
FIG. 2 illustrates a transfer function from a second base to a second object.

A transfer function from the second base 28 to the second object 21 is indicated by dashed lines in FIG. 2. There appear two peaks in the dashed lines in FIG. 2 corresponding to the two natural frequencies of the fourth system. If peak values in the dashed lines in FIG. 2 can be damped, vibration transmitted from the floor 1 to the second object 21 can be reduced to the lower frequency.

Thus, in a first exemplary embodiment, there is arranged a displacement sensor (first displacement detector) 32 that detects relative displacement between the second object 21 and the third object 22 (a relative position, or a position or displacement of the other with respect to one of the second object 21 and the third object 22). In FIG. 1A, the displacement sensor 32 is attached to the third object 22, but may be attached to the second object 21.

The second actuator (second drive unit) 33 for displacing the third object 22 in the vertical direction is provided between the third object 22 and the second base 28. The second actuator 33 can include a voice coil motor. FIG. 3 illustrates a transfer function from the second actuator 33 to the displacement sensor 32. It can be seen from FIG. 3 that, if an output 31 of the displacement sensor 32 is fed back to the second actuator 33, the peak values in FIG. 3 can be reduced.

Thus, in the first exemplary embodiment, a feedback control system. 39 is constituted by including the displacement sensor 32, an arithmetic unit 34, and the second actuator 33. The arithmetic unit (second arithmetic unit) 34 calculates, generates, and outputs a control signal (command value) 35 to the second actuator 33 based on the output 31 of the displacement sensor 32 and a target value 30.

The arithmetic unit 34 can use a proportional-integral-derivative (PID) compensator that performs PID compensation calculation. In this case, a crossover frequency of the PID compensator is 100 Hz, a break frequency of an integrator is 17 Hz, and a break frequency of a differentiator is 33 Hz. It is desirable to set the crossover frequency of the PID compensator to be higher than two natural frequencies of the fourth system.

Figure 4:
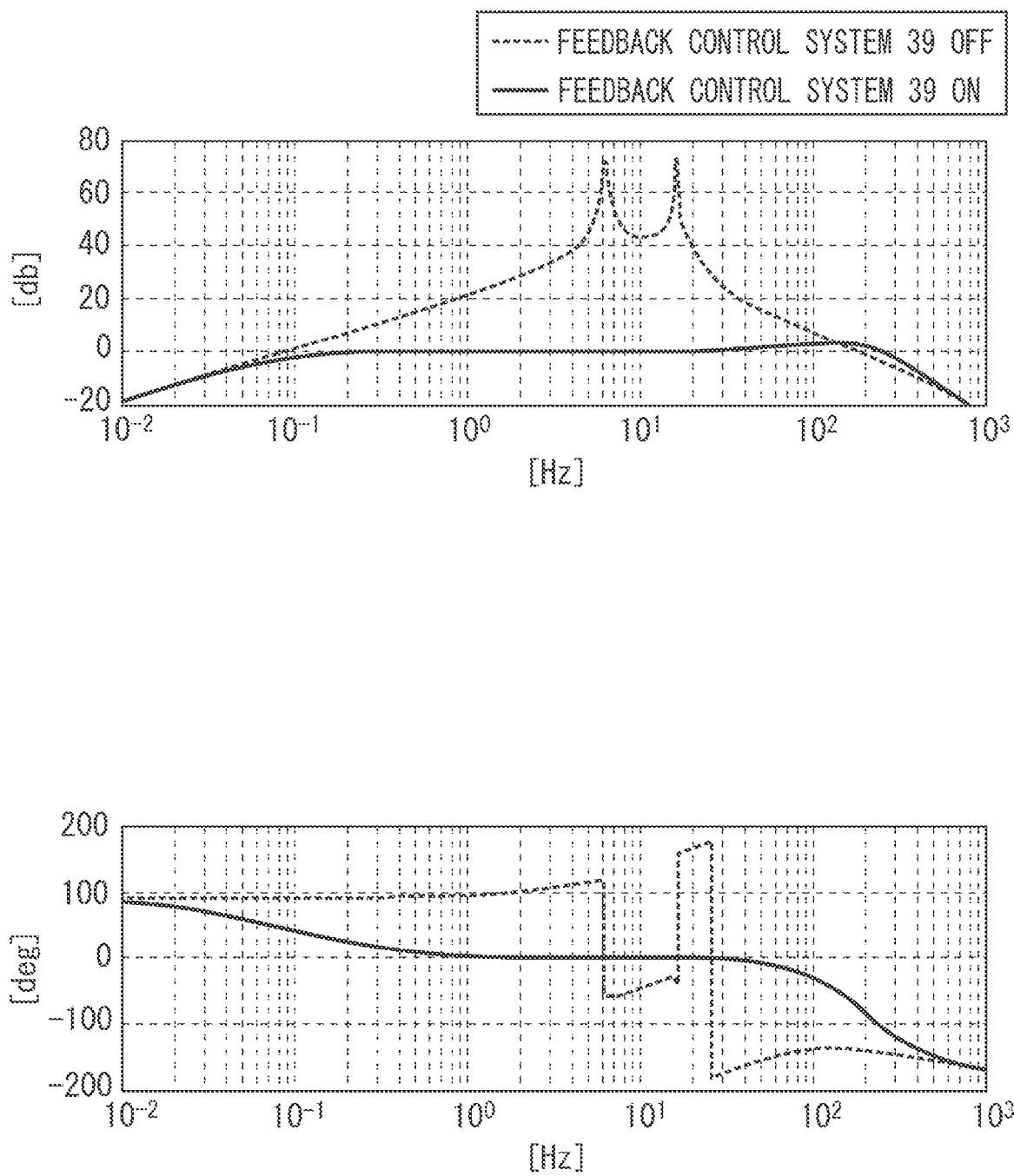
FIG. 4 illustrates a transfer function of a feedback control system.

In FIG. 4, an open-loop transfer function of the feedback control system 39 is indicated in dashed lines, and a closed-loop transfer function is indicated in solid lines. The integrator of the PID compensator performs compensation to retard a phase of the crossover frequency at low-frequency side of two crossover frequencies of the open-loop transfer function. In addition, the differentiator of the PID compensator performs compensation to advance a phase of the crossover frequency at high-frequency side of two crossover frequencies of the open-loop transfer function.

In addition, a high-pass filter that suppresses low-frequency components of the output 31 from being integrated may be added to the integrator of the PID compensator. Referring to the closed-loop transfer function indicated by the solid lines in FIG. 4, it can be seen that two peaks in the fourth system are not shown.

The solid lines in FIG. 2 indicate a transfer function from the second base 28 to the second object 21 in a case where the feedback control system 39 is added. By adding the feedback control system 39, the peaks corresponding to the natural frequency of the fourth system disappear, and it can be seen that vibration with low frequency 0.1 Hz or above, which is transmitted from the floor 1 to the second object 21, is greatly reduced.

Now, a magnitude relation between masses of the second object 21 and the third object 22 will be described. A mass of the second object 21 is denoted by M1, a mass of the third object 22 is denoted by M2. Rigidity and a damping coefficient of each of the second spring mechanism 23 and the third spring mechanism 24 are set to predetermined values. A transfer function from the second actuator 33 to the displacement sensor 32 in the case of M1=M2 is indicated by the dashed lines in FIG. 5. A transfer function from the second actuator 33 to the displacement sensor 32 in the case of M1>M2 is indicated by the solid lines in FIG. 5.

It can be seen from FIG. 5 that a crossover frequency at low-frequency side of two crossover frequencies at an arbitrary gain is at further low-frequency side in the case of M1>M2 than that in the case of M1=M2. This means that, in a case where a gain of the feedback control system 39 is the same, vibration transmitted from the floor 1 to the second object 21 in the case of M1>M2 can be reduced to the further low-frequency side. Hence, it is desirable to provide the second object 21 and the third object 22 to satisfy M1>M2. To this end, a material of the second object 21 may differ from a material of the third object 22. For example, as the material of the second object 21, tungsten or the like with large density can be employed.

In the detection system 30V, a displacement sensor (second displacement detector) 42 detects relative displacement between the control target 2 and the second object 21 (a relative position, or a position or displacement of the other with respect to one of the control target 2 and the second object 21), and outputs the relative displacement as a detection signal 41. In FIG. 1A, the displacement sensor 42 is attached to the control target 2, but the displacement sensor 42 may be attached to the second object 21.

Next, a method for controlling the control target 2 will be described below with reference to FIG. 1A. The control target 2 is subjected to position feedback control by the feedback control system 9 based on the detection signal 41. An arithmetic unit (first arithmetic unit) 5 in the feedback control system 9 calculates, generates, and outputs a control signal (command value) 6 to the first actuator 4 based on the detection signal 41 and a target value 10. Here and hereinafter, the 'arithmetic unit' may be called as a 'computing device'.

The arithmetic unit 5 can be used as a PID compensator that performs PID compensation calculation. In this case, the PID compensator can set a crossover frequency thereof to 50 Hz, a break frequency of the integrator thereof to 8 Hz, and a break frequency of the differentiator thereof to 17 Hz.

In the above descriptions, a position sensor is used as the displacement detector 42, but the displacement detector 42 may be a velocity sensor that detects a relative velocity between the control target 2 and the second object 21, or may be an acceleration sensor that detects relative acceleration between the control target 2 and the second object 21. In this case, the feedback control system 9 can be a velocity feedback control system, or an acceleration feedback control system.

Figure 6:
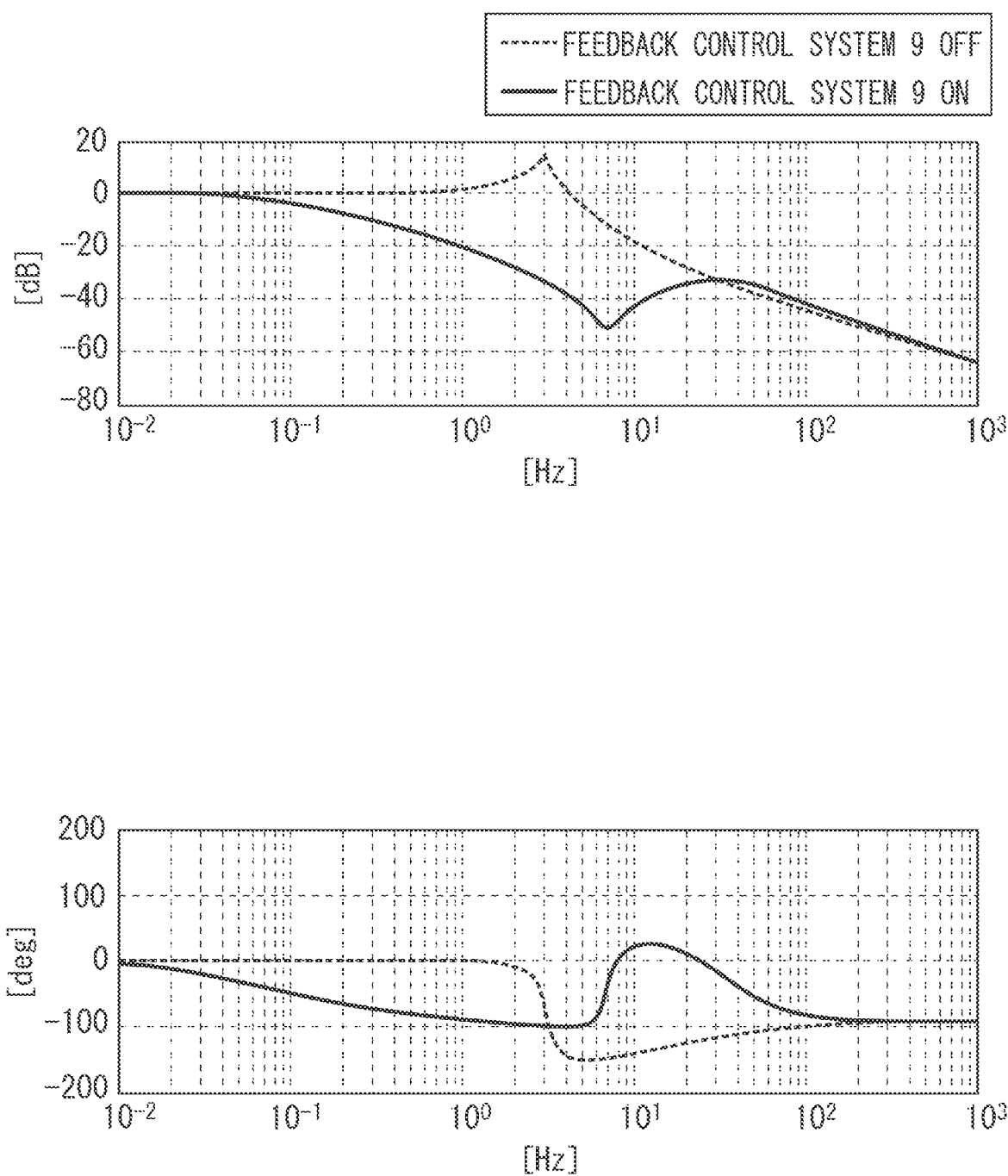
FIG. 6 illustrates a transfer function from a first base to a control target.

The effects of the present exemplary embodiment will be described below with reference to FIG. 6 and FIG. 7. The dashed lines in FIG. 6 indicate a transfer function from the first base 8 to the control target 2 when the feedback control system 9 is turned off. The solid lines in FIG. 6 indicate a transfer function from the first base 8 to the control target 2 when the feedback control system 9 is turned on. In the dashed lines in FIG. 6, a peak corresponding to the natural frequency of the first system appears. By turning on the feedback control system 9, it can be seen that that vibration, ranging about 0.1 Hz to 30 Hz, to be transmitted from the floor 1 to the control target 2 can be greatly reduced.

Figure 7:
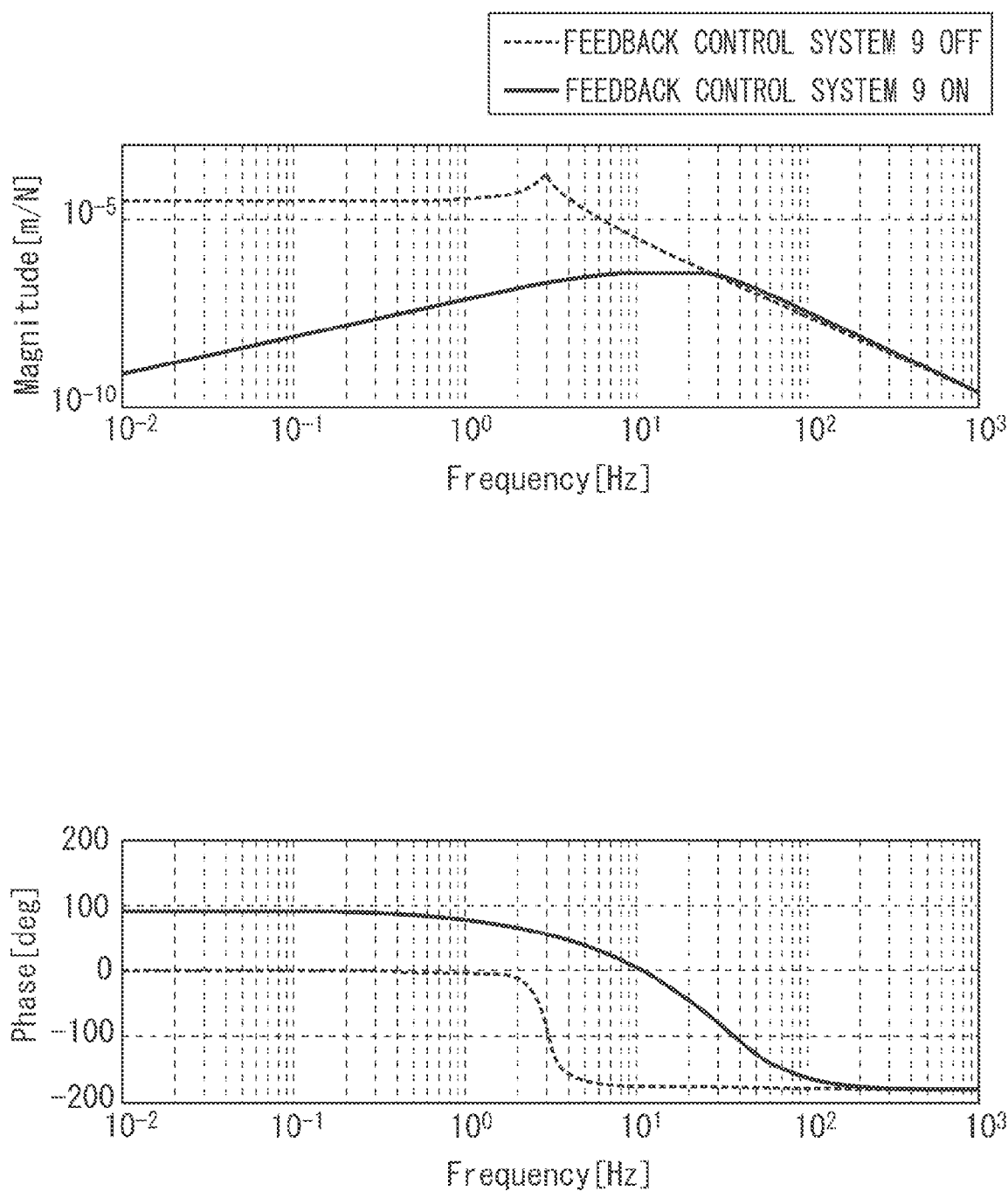
FIG. 7 illustrates a transfer function of compliance of a control target.

The dashed lines in FIG. 7 indicate a transfer function of compliance (displacement/force, i.e., reciprocal of rigidity) of the control target 2 when the feedback control system 9 is turned off. Further, the solid lines in FIG. 7 indicate a transfer function of the compliance of the control target 2, when the feedback control system 9 is turned on. It can be seen that vibration with less than or equal to about 30 Hz generated on the control target 2 can be greatly reduced by turning on the feedback control system 9.

As described above, the vibration control apparatus which can greatly reduces low-frequency vibration generated on the floor 1 and the control target 2 and transmitted to the control target 2 can be realized with use of the feedback control system 9. Such the vibration control apparatus is suitable for causing the control target 2 to follow the target value 10.

The vibration control apparatus 50V can function as a vibration isolation apparatus by giving a predetermined constant as the target value 10. Further, the vibration control apparatus 50V can function as a vibrating apparatus that vibrates the control target 2 by giving a target value which changes with time as the target value 10.

Figure 8:
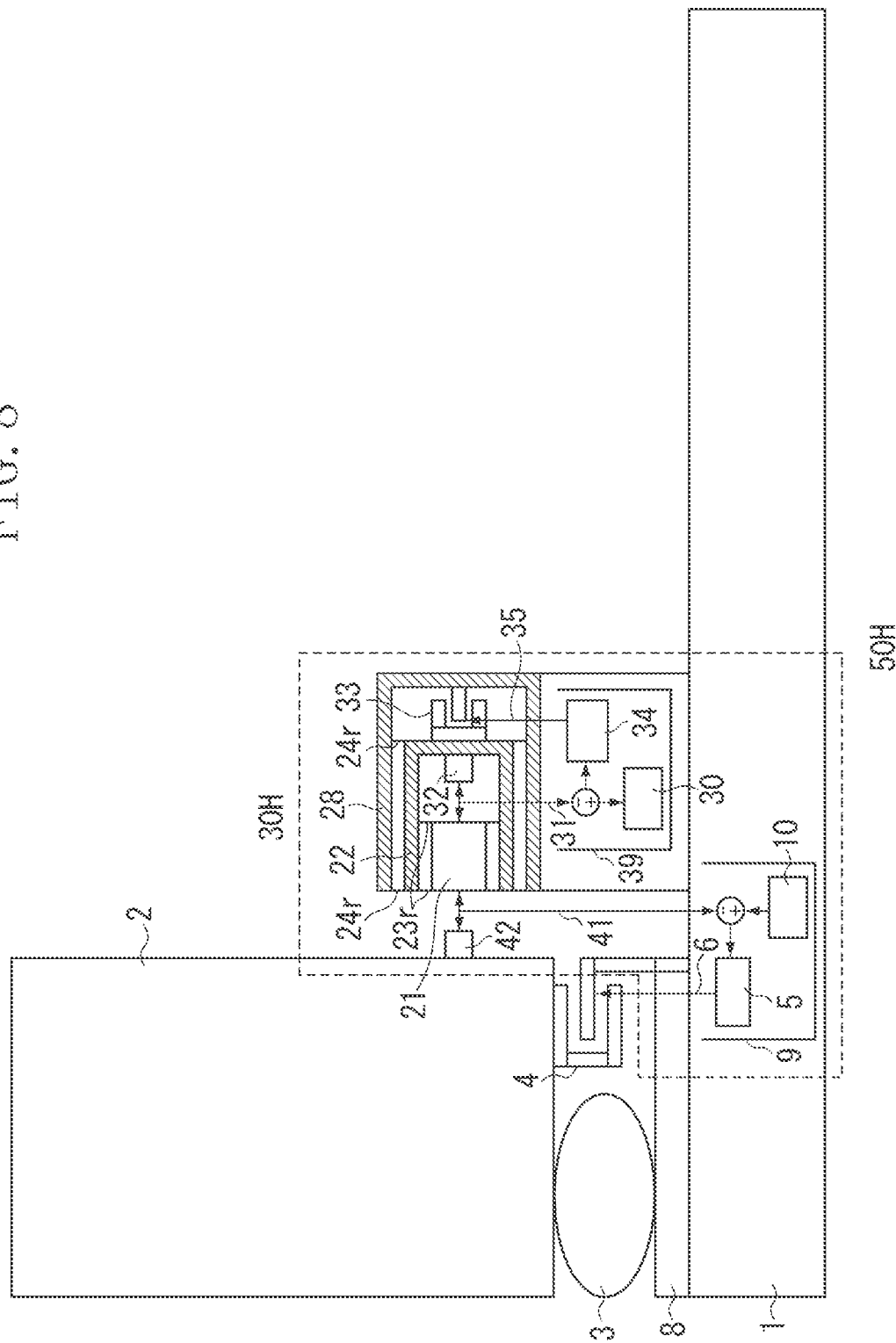
FIG. 8 illustrates a configuration of a vibration control apparatus according to a second exemplary embodiment.

In the first exemplary embodiment, the vibration control apparatuses 50V and 50V1 are described which control vibration of the control target (the first object) 2 in the vertical direction. In a second exemplary embodiment, a vibration control apparatus 50H will be described which controls vibration of the control target (the first object) 2 in the horizontal direction. FIG. 8 illustrates a configuration of the vibration control apparatus 50H.

In a detection system 30H in the vibration control apparatus 50H, the second object 21 is supported by the third object 22 via a second spring mechanism (plate spring) 23r. The third object 22 is supported by the second base 28 via a third spring mechanism (plate spring) 24r. The second base 28 is fixed onto the floor 1. The first spring mechanism. 23r and the second spring mechanism 24r are configured to be symmetrical (axisymmetrical) with respect to a straight line connecting the center of gravity of the second object 21 and the center of gravity of the third object 22.

As illustrated in FIG. 8, by supporting the second object 21 and the third object 22 each by the plate springs (the first spring mechanism 23r and the second spring mechanism 24r), the second object 21 and the second reference object 22 can be movably supported in the horizontal direction without using an expensive guide mechanism.

A method for controlling the third object 22 and the control target 2 is similar to that in the first exemplary embodiment. When feedback control is performed on the third object 22, a rotational mode (a tilt with respect to the horizontal direction) of the second object 21 or the third object 22 is excited, a feedback control system 39 can be oscillated.

Thus, in the second exemplary embodiment, as illustrated in FIG. 8, the second actuator 33 is arranged such that the straight line connecting the center of gravity of the second object 21 and the center of gravity of the third object 22 and an axis (a line of action of force) of the second actuator 33 become coaxial (overlapped) with each other. Accordingly, excitation of the rotational mode of the second object 21 or the third object 22 by the second actuator 33 can be suppressed.

Further, in the second exemplary embodiment, a displacement detector 32 is arranged on the straight line connecting the center of gravity of the second object 21 and the center of gravity of the third object 22. Accordingly, even if the rotational mode of the second object 21 or the third object 22 is excited, a measurement error due to the rotational mode in the output 31 can be reduced. In this manner, the second object 21, the second spring mechanism 23r, the third object 22, the third spring mechanism 24r, the displacement detector 32, and the second actuator 33 are preferably arranged on the same axis.

In the second exemplary embodiment, a displacement detector 42 is also arranged on the straight line connecting the center of gravity of the second object 21 and the center of gravity of the third object 22. Accordingly, an Abbe error in the detection signal 41 due to relative inclination between the control target 2 and the second object 21 can be reduced. In this manner, the displacement detector 42 is also preferably arranged on the above-described same axis.

Figure 1C:
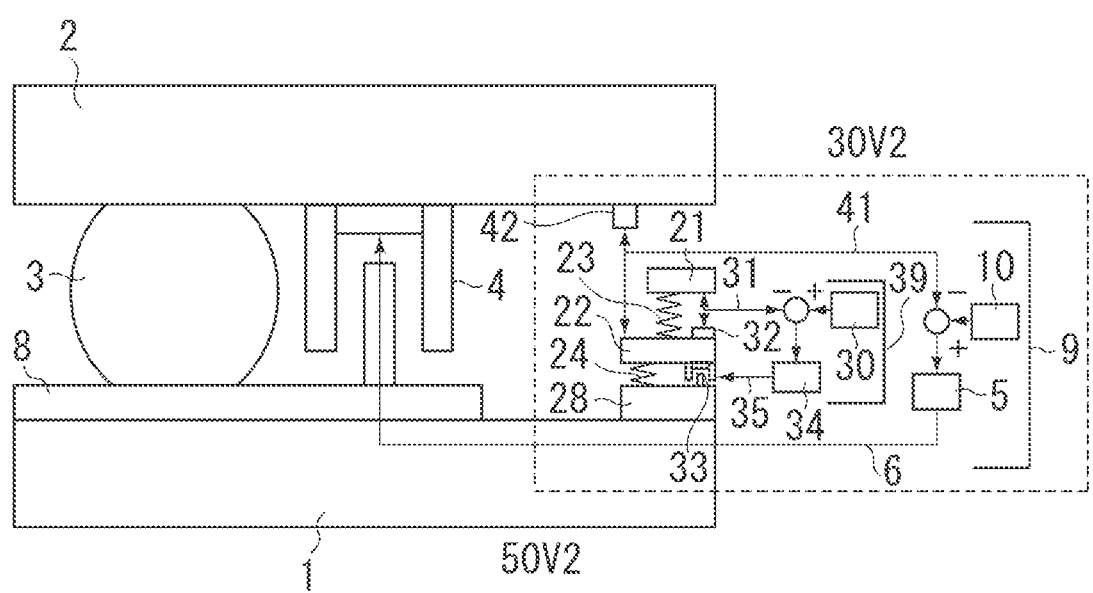

The displacement detector 42 in the detection systems 30V, 30V1, and 30H according to the first and the second exemplary embodiments detect relative displacement between the control target 2 and the second object 21. On the other hand, according to a third exemplary embodiment, as illustrated in FIG. 1C, the displacement detector 42 in a detection system 30V2 is configured to detect relative displacement between the control target 2 and the third object 22.

The detection system 30V2 that detects relative displacement between the control target 2 and the third object 22 in the vertical direction will be described below by way of example. However, by referring to the second exemplary embodiment, it is apparent that the detection system that detects relative displacement between the control target 2 and the third object 22 in the horizontal direction can be constituted.

Figure 9:
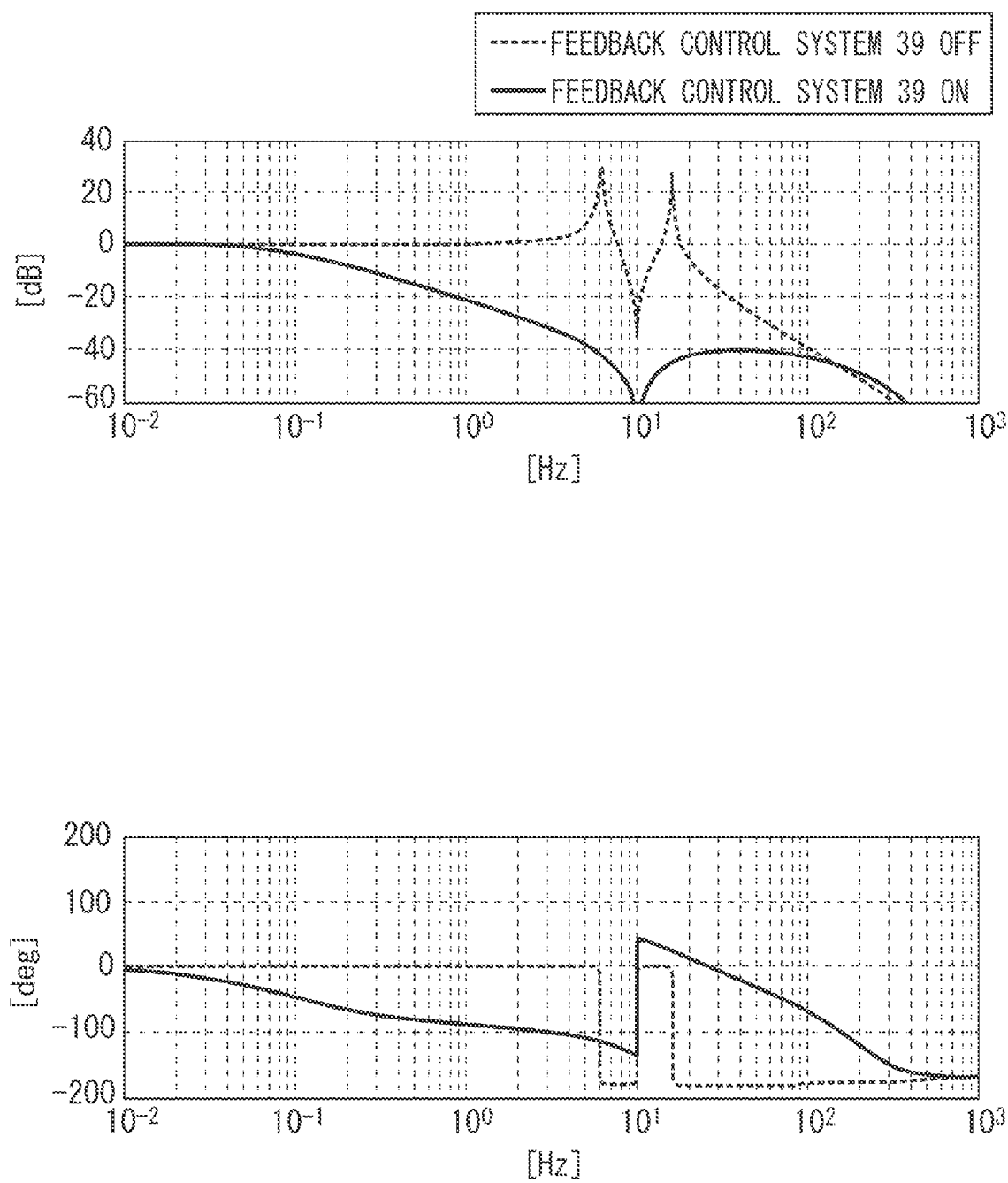
FIG. 9 illustrates a transfer function from a second base to a third object.

The effects of the present exemplary embodiment will be described below with reference to FIG. 9. The dashed lines in FIG. 9 indicate a transfer function from the second base 28 to the third object 22. Further, the solid lines in FIG. 9 indicate a transfer function from the second base 28 to the third object 22, in a case where the feedback control system 39 is constituted. By adding the feedback control system 39, the peaks corresponding to the natural frequency of the fourth system disappear, and it can be seen that vibration with low frequency of about 0.1 Hz or above, which is transmitted from the floor 1 to the third object 22, is greatly reduced.

Figure 10:
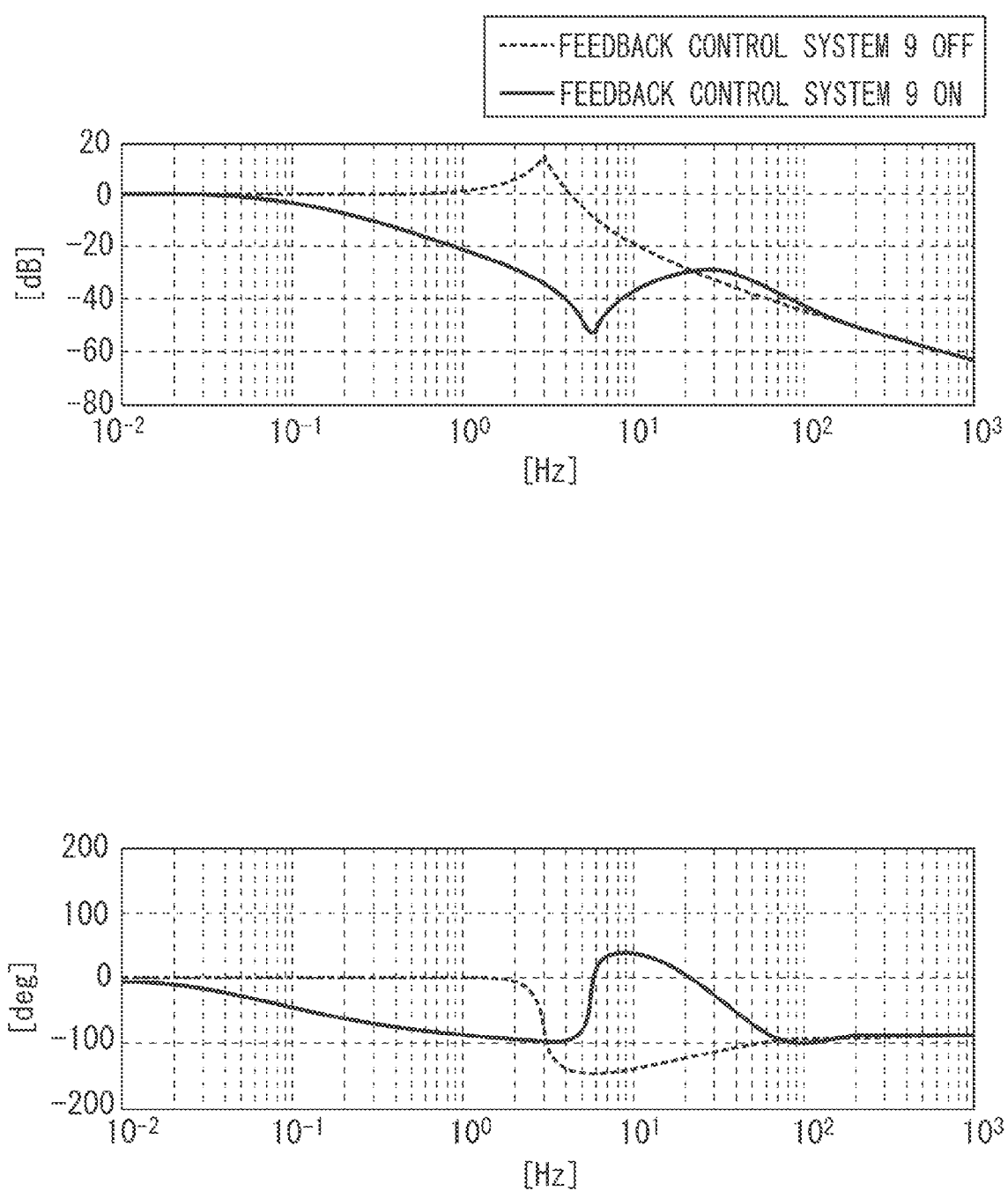
FIG. 10 illustrates a transfer function from a first base to a control target.

The dashed lines in FIG. 10 indicate a transfer function from the first base 8 to the control target 2, when the feedback control system 9 is turned off. The solid lines in FIG. 10 indicate a transfer function from the first base 8 to the control target 2, when the feedback control system 9 is turned on. It can be seen that low-frequency vibration ranging from about 0.1 Hz to about 20 Hz transmitted from the floor 1 to the control target 2 can be greatly reduced by turning on the feedback control system 9.

Figure 11:
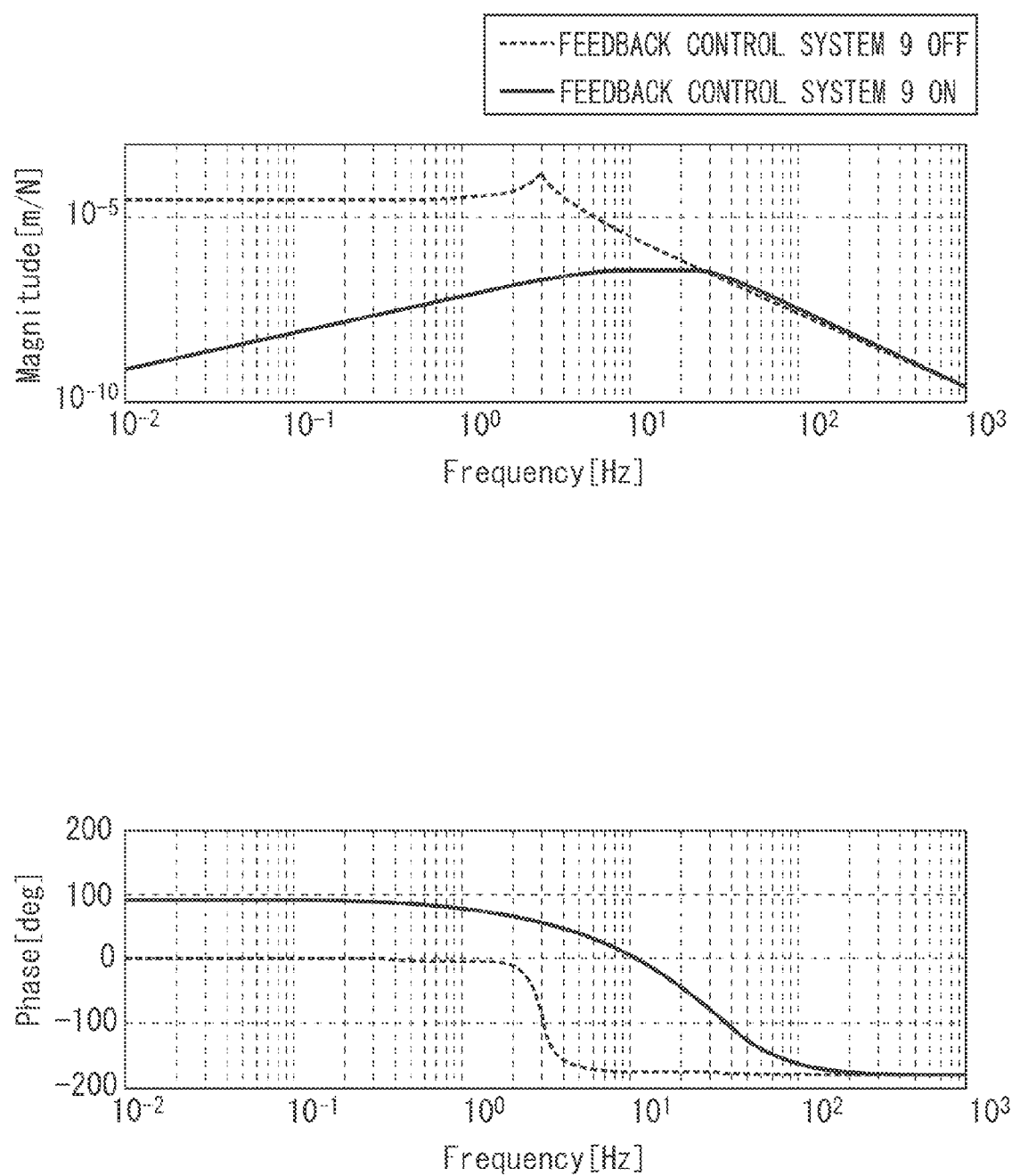
FIG. 11 illustrates a transfer function of compliance of a control target.

The dashed lines in FIG. 11 indicate a transfer function of compliance of the control target 2, when the feedback control system 9 is turned off. Further, the solid lines in FIG. 11 indicate a transfer function of the compliance of the control target 2, when the feedback control system 9 is turned on. It can be seen that vibration with low frequency of about 30 Hz or below generated on the control target 2 can be greatly reduced by turning on the feedback control system 9.

More specifically, the low-frequency vibration transmitted to the control target 2 can be also greatly reduced by detecting the relative displacement between the control target 2 and the third object 22 with the displacement detector 42 and performing feedback control on the control target 2 based on the detection signal 41.

The displacement detector 42 can be configured to output the relative displacement between at least one of the second object 21 and the third object 22 and the control target 2. For example, the displacement detector 42 may be configured to selectively output the relative displacement between the control target 2 and the second object 21, or the relative displacement between the control target 2 and the third object 22.

Further, for example, the displacement detector 42 may be configured to detect the relative displacement between the control target 2 and the second object 21 and the relative displacement between the control target 2 and the third object 22, and to output an average value of these detected values.

A fourth exemplary embodiment includes at least six detection systems 30X (three or more detection systems relating to the horizontal direction, and three or more detection systems relating to the vertical direction) like the above-described detection systems 30V and 30H, and performs vibration control with six degrees of freedom on the control target 2.

Figure 12A:
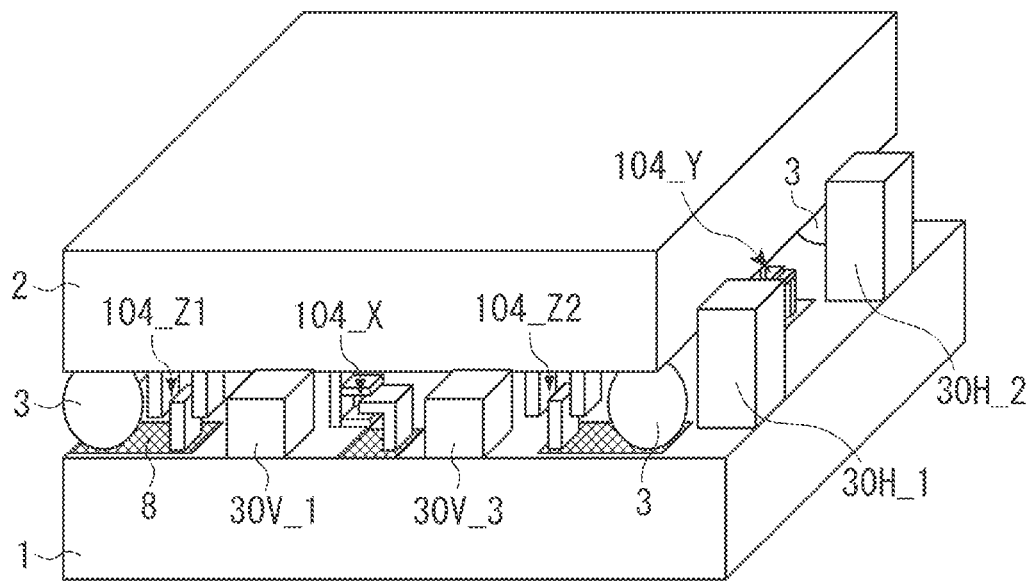
FIGS. 12A and 12B illustrate configurations of vibration control apparatuses with six degrees of freedom according to fourth and fifth exemplary embodiments.

As illustrated in FIG. 12A, three detection systems relating to the vertical direction 30V_1, 30V_2 (not illustrated), and 30V_3, and three detection systems relating to the horizontal direction 30H_1, 30H_2, and 30H_3 (not illustrated) are mounted (arranged) on the floor 1. The detection signal 41 is obtained by the displacement detector 42 of each of the detection systems 30V_1, 30V_2, and 30V_3, and the detection systems 30H_1, 30H_2, and 30H_3.

First actuators 104 are configured to include three actuators relating to a Z-axis direction, one actuator relating to an X-axis direction, and two actuators relating to a Y-axis direction in order to displace the control target 2 in six degrees of freedom. In FIG. 12A, among the six sets of the first actuators 104, only an actuator in the X-axis direction 104_X, an actuator in the Y-axis direction 104_Y1, and actuators in the Z-axis direction 104_Z1 and 104_Z2 are illustrated.

Figure 13:
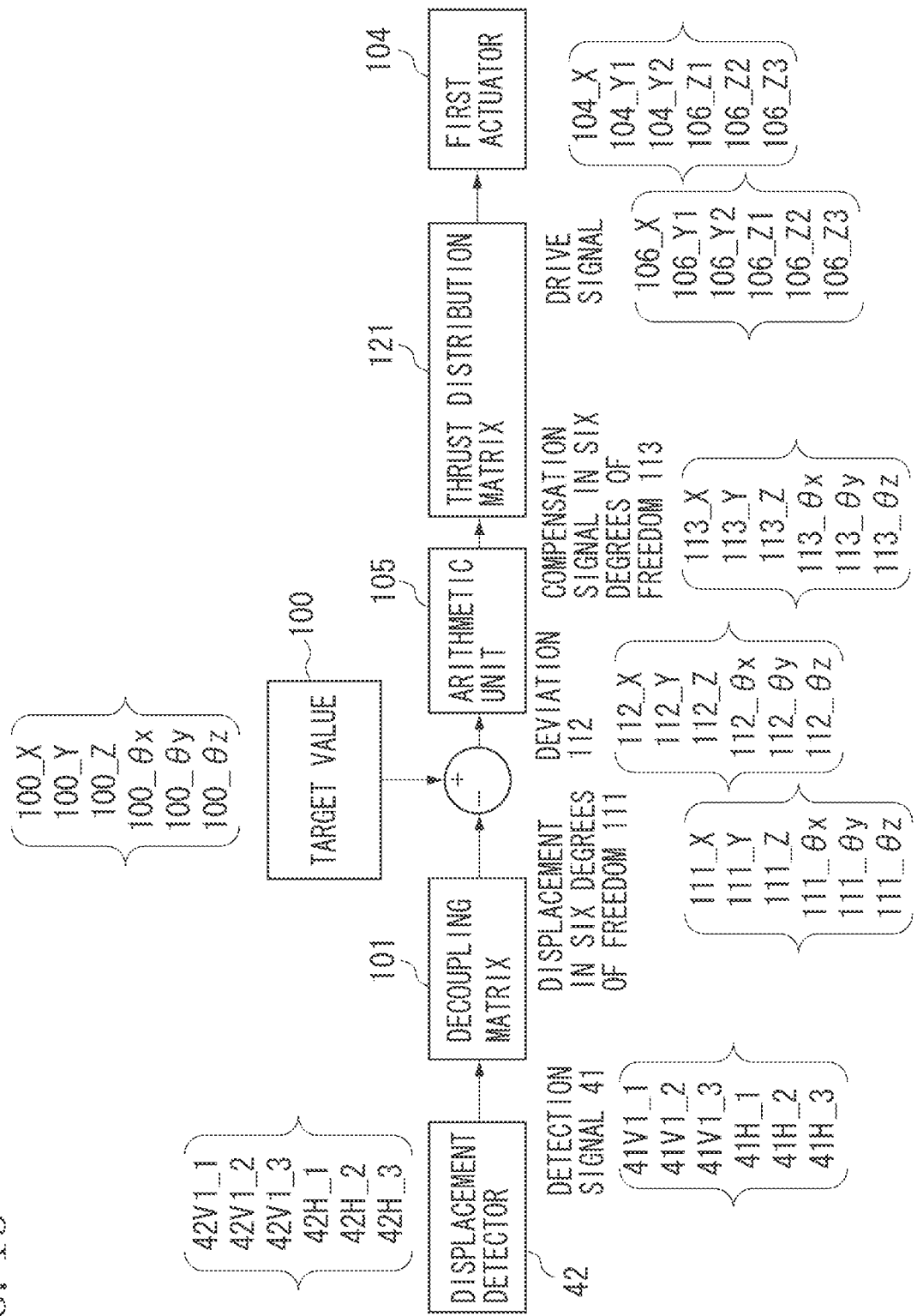
FIG. 13 is a block line diagram illustrating vibration control of a control target 2 in the six degrees of freedom.

FIG. 13 is a block line diagram illustrating vibration control of the control target 2 in six degrees of freedom. As illustrated in FIG. 13, the detection signals 41 of the displacement detectors 42 are converted into displacement in six degrees of freedom (6 axes) 111 in X-Y-Z coordinate systems with the origin at the center of gravity of the control target 2 by a decoupling matrix 101.

Subsequently, difference between the displacement information 111 and the target value 100 with respect to the control target 2 is calculated to determine deviation 112. The arithmetic unit 105 performs compensation calculation on the deviation 112, and outputs compensation signals 113 with six degrees of freedom for reducing the deviation. Six compensation signals 113 are respectively converted into six drive signals 106 of the first actuators 104 by a thrust distribution matrix 121.

The obtained drive signals 106 are transmitted to the first actuators 104, and the control target 2 is displaced in the six degrees of freedom (6 axes directions). Through the above process, vibration of the control target 2 can be controlled in the six degrees of freedom.

For the detection system 30V and the detection system 30H according to the fourth exemplary embodiment, the detection system 30V and the detection system 30H described in either one of the first exemplary embodiment to the third exemplary embodiment can be used, respectively.

Figure 12B:
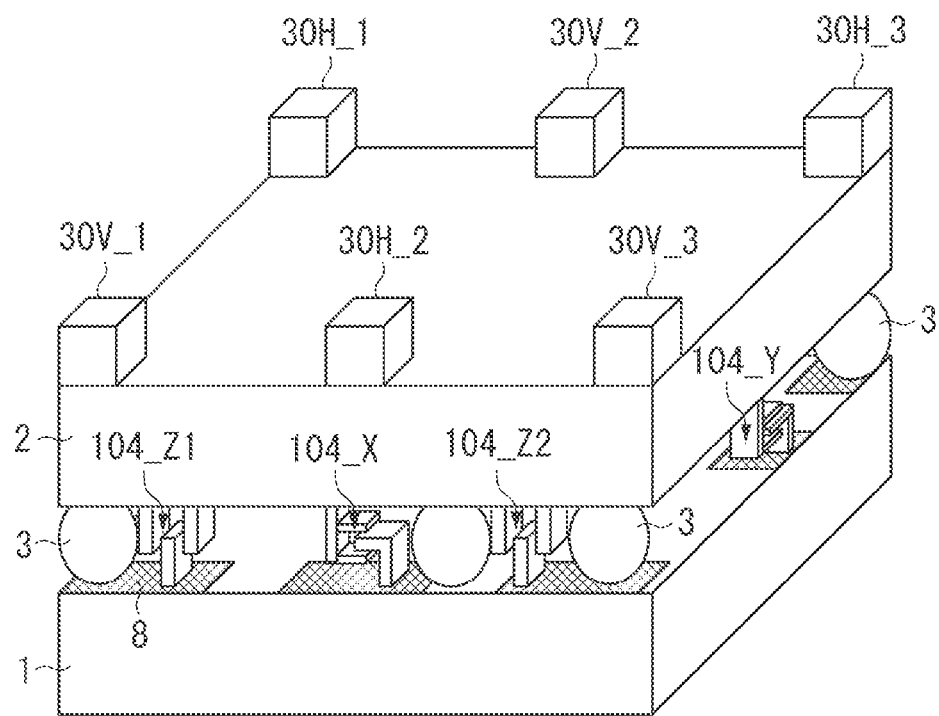

In the fourth exemplary embodiment, three detection systems relating to the vertical direction 30V_1, 30V_2, and 30V_3, and three detection systems relating to the horizontal direction 30H_1, 30H_2, and 30H_3 are mounted (arranged) on the floor 1. On the other hand, in a fifth exemplary embodiment, as illustrated in FIG. 12B, the detection systems 30V_1, 30V_2, and 30V_3 and the detection systems 30H_1, 30H_2, and 30H_3 are mounted (arranged) on the control target 2.

In other words, the second base 28 is fixed to the control target 2. Further, the detection systems 30V_1, 30V_2, and 30V_3 and the detection systems 30H_1, 30H_2, and 30H_3 detect relative displacement between the control target 2 and the second object 21, or relative displacement between the control target 2 and the third object 22, and outputs the detection signals 41. Control of the control target 2 can be performed in a similar manner to the one described in the fourth exemplary embodiment.

For the detection system 30V and the detection system 30H according to the fifth exemplary embodiment 5, the detection system 30V and the detection system 30H described in either one of the first exemplary embodiment to the third exemplary embodiment 3 can be used, respectively.

A manufacturing method for an article according to the exemplary embodiments of the present invention suitable for manufacturing of an article having a microstructure, such as a semiconductor device and a liquid crystal display element. The manufacturing method can include a process for forming a latent image pattern on a photosensitive material coated on a substrate using the above-described drawing apparatus or the exposure apparatus and a process for developing the substrate on which the latent image pattern is formed by the forming process. Further, the manufacturing method can include other well-known processes (e.g., oxidation, film formation, vapor deposition, doping, planarization, etching, resist stripping, dicing, bonding, and packaging).

The manufacturing method for an article according to the present exemplary embodiment includes a process for forming a pattern on a substrate (e.g., wafer, glass plate or film-like substrate) using the above-described imprint apparatus. Further, the manufacturing method can include a process for etching the substrate on which the pattern is formed.

Furthermore, the manufacturing method can include other well-known processes (e.g., oxidation, film formation, vapor deposition, doping, planarization, resist stripping, dicing, bonding, and packaging). In a case where articles, such as patterned media (recording media) and an optical element, are manufactured, the manufacturing method can include another well-known process for processing the substrate on which the pattern is formed, in place of the above-described etching.

As described above, the manufacturing method for articles according to the present exemplary embodiment includes a process for transferring a pattern onto a substrate using a lithography apparatus and a process for processing the substrate onto which the pattern is transferred by the transferring process. The manufacturing method for articles according to the present exemplary embodiment is suitable in terms of at least one of performance, quality, productivity, and production cost of the articles, as compared with the conventional method.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2010-244365 filed Oct. 29, 2010, which is hereby incorporated by reference herein in its entirety.

What is claimed is:

1. A vibration control apparatus comprising:
   a first object;
   a first spring mechanism configured to support the first object, wherein a first system includes the first object and the first spring mechanism;
   a first actuator configured to apply a force to the first object;
   a detection system configured to detect a position of the first object; and
   a first computing device configured to generate a command value for the first actuator based on an output of the detection system to control vibration of the first object, wherein the detection system includes:
   a second object,
   a second spring mechanism configured to support the second object, wherein a second system includes the second object and the second spring mechanism,
   a third object configured to support the second spring mechanism, wherein the detection system is configured to detect a position of the first object relative to at least one of the second object and the third object,
   a third spring mechanism configured to support the third object, wherein a third system includes the third object and the third spring mechanism,
   a first displacement detector configured to detect displacement of the third object relative to the second object,
   a second actuator configured to apply a force to the third object, and
   a second computing device configured to generate a command value for the second actuator based on an output of the first displacement detector to reduce the displacement of the third object relative to the second object,
   wherein the detection system is configured such that a second natural frequency of the second system is higher than a first natural frequency of the first system, and a third natural frequency of the third system is higher than the first natural frequency.

2. The vibration control apparatus according to claim 1, wherein a fourth system includes the second object, the second spring mechanism, the third object, and the third spring mechanism, and wherein the detection system is configured such that one of two natural frequencies of the fourth system is lower than the first natural frequency and the other of the two natural frequencies of the fourth system is higher than the first natural frequency.

3. The vibration control apparatus according to claim 1, wherein a fourth system includes the second object, the second spring mechanism, the third object, and the third spring mechanism, and wherein the detection system is configured such that both of two natural frequencies of the fourth system are higher than the first natural frequency.

4. The vibration control apparatus according to claim 1, wherein a fourth system includes the second object, the second spring mechanism, the third object, and the third spring mechanism, and wherein the detection system is configured such that a crossover frequency of the second computing device is higher than two natural frequencies of the fourth system.

5. The vibration control apparatus according to claim 1, wherein a mass of the second object is greater than a mass of the third object.

6. The vibration control apparatus according to claim 1, wherein the first spring mechanism and the first actuator are supported by a floor, and the second object, the second spring mechanism, the third object, the third spring mechanism, the first displacement detector, and the second actuator are supported by the floor without intervention of the first spring mechanism and the first actuator.

7. The vibration control apparatus according to claim 1, wherein the first spring mechanism and the first actuator are supported by a floor, and the second object, the second spring mechanism, the third object, the third spring mechanism, the first displacement detector, and the second actuator are supported by the first object.

8. The vibration control apparatus according to claim 1, wherein the detection system further includes a second displacement detector configured to detect displacement of the first object relative to at least one of the second object and the third object.

9. The vibration control apparatus according to claim 8, wherein the second displacement detector is provided with the first object.

10. The vibration control apparatus according to claim 1, wherein the second object, the second spring mechanism, the third object, the third spring mechanism, the first displacement detector, and the second actuator are arranged on a same axis.

11. The vibration control apparatus according to claim 10, wherein the detection system further includes a second displacement detector configured to detect displacement of the first object relative to at least one of the second object and the third object, and the second displacement detector is arranged on the same axis as the first displacement detector.

12. The vibration control apparatus according to claim 1, wherein the first computing device is configured to generate the command value for the first actuator based on the output of the detection system so that vibration of the first object is reduced.

13. The vibration control apparatus according to claim 1, wherein the first computing device is configured to generate the command value for the first actuator based on the output of the detection system so that the first object performs target vibration.

14. A lithography apparatus that transfers a pattern onto a substrate, the lithography apparatus comprising:
   the vibration control apparatus according to claim 1; and
   a mounted unit mounted on the vibration control apparatus.

15. The lithography apparatus according to claim 14, further comprising an imprint apparatus including a holder configured to hold at least one of the substrate and a mold, and configured to utilize the mold to mold an uncured layer on the substrate to form a pattern on the substrate, wherein the mounted unit includes the holder.

16. The lithography apparatus according to claim 14, further comprising a drawing apparatus including a projection system configured to project a charged particle beam and a holder configured to hold at least one of the substrate and the projection system, and configured to project the charged particle beam via the projection system onto a layer on the substrate to perform drawing on the layer, wherein the mounted unit includes the holder.

17. A method of manufacturing an article, the method comprising:
   transferring a pattern onto a substrate using the lithography apparatus according to claim 14; and
   processing the substrate, onto which the pattern has been transferred, to manufacture the article,
   wherein the lithography apparatus includes:
   a vibration control apparatus, and a mounted unit mounted on the vibration control apparatus, wherein the vibration control apparatus includes:

a first object, a first spring mechanism configured to support the first object, wherein a first system includes the first object and the first spring mechanism, a first actuator configured to apply a force to the first object, a detection system configured to detect a position of the first object, and a first computing device configured to generate a command value for the first actuator based on an output of the detection system to control vibration of the first object, wherein the detection system includes:

a second object, a second spring mechanism configured to support the second object, wherein a second system includes the second object and the second spring mechanism, a third object configured to support the second spring mechanism, wherein the detection system is configured to detect a position of the first object relative to at least one of the second object and the third object, a third spring mechanism configured to support the third object, wherein a third system includes the third object and the third spring mechanism, a first displacement detector configured to detect displacement of the third object relative to the second object, a second actuator configured to apply a force to the third object, and a second computing device configured to generate a command value for the second actuator based on an output of the first displacement detector to reduce the displacement of the third object relative to the second object, wherein the detection system is configured such that a second natural frequency of the second system is higher than a first natural frequency of the first system, and a third natural frequency of the third system is higher than the first natural frequency.

18. A vibration control apparatus comprising:

a first object;

a first spring mechanism configured to support the first object, wherein a first system includes the first object and the first spring mechanism;

a first actuator configured to apply a force to the first object;

a detection system configured to detect a position of the first object; and a first computing device configured to generate a command value for the first actuator based on an output of the detection system to control vibration of the first object, wherein the detection system includes:

a second object, a second spring mechanism configured to support the second object, wherein a second system includes the second object and the second spring mechanism, a third object configured to support the second spring mechanism, wherein the detection system is configured to detect a position of the first object relative to at least one of the second object and the third object, a third spring mechanism configured to support the third object, wherein a third system includes the third object and the third spring mechanism, a first displacement detector configured to detect displacement of the third object relative to the second object, a second actuator configured to apply a force to the third object, and a second computing device configured to generate a command value for the second actuator based on an output of the first displacement detector to reduce the displacement of the third object relative to the second object, wherein the detection system is configured such that a second natural frequency of the second system is higher than a first natural frequency of the first system, and a third natural frequency of the third system is higher than the first natural frequency, and wherein the second computing device includes a high-pass filter for a component based on an output of the first displacement detector, and an integrator for an output of the high-pass filter.

* * * * *